United States Patent
Wark

[19]

[11] Patent Number: 6,060,769
[45] Date of Patent: *May 9, 2000

[54] FLIP-CHIP ON LEADS DEVICES

[75] Inventor: James M. Wark, Boise, Id.

[73] Assignee: Micron Technology, Inc., Boise, Id.

[*] Notice: This patent issued on a continued prosecution application filed under 37 CFR 1.53(d), and is subject to the twenty year patent term provisions of 35 U.S.C. 154(a)(2).

[21] Appl. No.: 08/940,306

[22] Filed: Sep. 30, 1997

Related U.S. Application Data

[62] Division of application No. 08/710,707, Sep. 20, 1996, Pat. No. 5,817,540.

[51] Int. Cl.[7] .................................................. H01L 23/495
[52] U.S. Cl. ........................... 257/666; 257/735; 257/786
[58] Field of Search .................................... 257/666, 778, 257/786, 776, 787, 735

[56] References Cited

U.S. PATENT DOCUMENTS

| | | |
|---|---|---|
| 4,258,382 | 3/1981 | Harris . |
| 4,862,245 | 8/1989 | Pashby et al. . |
| 4,948,754 | 8/1990 | Kondo et al. . |
| 5,171,711 | 12/1992 | Tobimatsu . |
| 5,252,853 | 10/1993 | Michii . |
| 5,331,200 | 7/1994 | Teo et al. . |
| 5,384,487 | 1/1995 | Rostoker et al. ........................ 257/786 |
| 5,538,920 | 7/1996 | Wakabayashi . |
| 5,565,379 | 10/1996 | Baba . |
| 5,569,964 | 10/1996 | Ikebe ........................................ 257/786 |
| 5,578,526 | 11/1996 | Akram et al. . |
| 5,587,336 | 12/1996 | Wang et al. . |
| 5,677,567 | 10/1997 | Ma et al. ................................. 257/786 |

FOREIGN PATENT DOCUMENTS

| | | |
|---|---|---|
| 56-55063 | 5/1981 | Japan . |
| 60-154643 | 8/1985 | Japan . |

*Primary Examiner*—Carl Whitehead, Jr.
*Assistant Examiner*—Roy Potter
*Attorney, Agent, or Firm*—Trask, Britt & Rossa

[57] ABSTRACT

A semiconductor die assembly and methods of forming same comprising a lead frame having a plurality of lead fingers and a semiconductor die having a plurality of electric contact points on an active surface of said semiconductor die. The electric contact points are located or rerouted on the semiconductor die active surface so as to maximize the size and spacing of electric contact points relative to the lead fingers, which may be custom-configured to match the "open" array of contact points and widened to enhance surface area for connection thereto. This arrangement results in large and robust flip-chip type interconnections between the electric contact points and the lead frame, eliminating the need for wirebonding and for adhesive connections of the lead frame to the die active surface.

15 Claims, 3 Drawing Sheets

FLIP-CHIP ON LEADS DEVICES

PRIOR APPLICATION

This is a divisional of application Ser. No. 08/710,707, filed Sep. 20, 1996, now U.S. Pat. No. 5,817,540.

BACKGROUND OF THE INVENTION

1. Field of the Invention

The present invention relates to an apparatus and method for attaching a semiconductor die to a lead frame. More particularly, the present invention relates to use of "flip-chip" configured dice in combination with lead frames, and to relocating electric contact points of a semiconductor die, preferably a flip-chip, to "open" locations on the semiconductor die active surface to facilitate large, robust interconnection between the electric contact points and the lead frame.

2. State of the Art

Conventional lead frame design inherently limits package density for a given die size because the die-attach paddle of the lead frame must be larger than the die to which it is bonded. The larger the die, the less space that remains around the periphery of the die-bonding pad for wire bonding. Furthermore, the inner lead ends on the standard lead frame provide anchorage for the leads when the leads and the die are encapsulated in plastic. Therefore, as the die size is increased in relation to a given package size, there is a corresponding reduction in the space (depth) along the sides of the package for the encapsulating plastic which joins the top and bottom of the plastic body at the mold part line and anchors the leads. Thus, as the leads and encapsulant are subjected to the normal stresses of subsequent trimming, forming and assembly operations, the encapsulating plastic may crack, compromising package integrity and substantially increasing the probability of premature device failure.

One method of chip attachment which permits a larger die to be accommodated in a plastic package size originally developed for a smaller die is a so-called "lead-over-chip" ("LOC") arrangement. Conventional LOC devices employ a die with one or more central rows of bond pads, and have a plurality of leads which are disposed over and attached to the active surface of the semiconductor die, thus the name lead-over-chip. A "lead-under-chip" ("LUC") arrangement is substantially the same as the LOC arrangement, but with the leads extending under the semiconductor die. A primary advantage of LOC/LUC arrangements is that the ratio between the size of the semiconductor die and the size of a package which encapsulates the semiconductor die is relatively high in comparison to conventional devices employing dice with peripheral bond pads and leads terminating adjacent the die. This advantage is achieved because the semiconductor die is attached to the extended leads, and the packaging material does not merely interlock with the leads about the periphery of the package.

U.S. Pat. No. 4,862,245 issued Aug. 29, 1989 to Pashby et al. ("the '245 patent") illustrates an LOC arrangement on a semiconductor die 30. With reference to FIG. 5 herein, with such an arrangement a lead frame (periphery not shown) has a plurality of leads 36 which extends over the semiconductor die 30 toward a central or axial line of bond pads 34. A plurality of bond wires 32 makes the electrical connection between the inner ends of leads 36 and the bond pads 34. In wirebonding, the bond wires 32 are attached, one at a time, to their respective bond pads 34 on the semiconductor die 30 and extend to a corresponding lead or trace end 36 on a lead frame or printed circuit board (not shown). Bond wires as such as 32 are generally attached through one of three industry-standard wirebonding techniques: ultrasonic bonding—using a combination of pressure and ultrasonic vibration bursts to form a metallurgical cold weld; thermocompression bonding—using a combination of pressure and elevated temperature to form a weld; and thermosonic bonding—using a combination of pressure, elevated temperature, arrangement and ultrasonic vibration bursts. Film-type alpha barriers 38 are provided between the semiconductor die 30 and the leads 36, and are adhered to both, thus eliminating the need for a separate die paddle or other die support aside from the leads 36 themselves.

The configuration of the '245 patent is said to assist in limiting the ingress of corrosive environmental contaminants to the active surface of the die, achieve a larger portion of the circuit path length encapsulated in the packaging material applied after wire bonding, and reduce electrical resistance caused by the bond wires 32 by placing the lead ends in closer proximity to the bond pads 34 (i.e., the longer the bond wire, the higher the resistance). Although this configuration offers certain advantages, it requires that bond wires 32 be individually attached between the bond pads 34 and the leads 36. Furthermore, bond wires exhibit an inherent problem called bond wire sweep. When encapsulating a bare die assembly, the die assembly is generally placed in a mold and a molten filled-polymer encasing material is injected under pressure into the mold. The molten encasing material then surrounds and encases the die assembly as it conforms to the mold cavity. Although encapsulation is an effective means for protecting a bare die assembly, the flow front of the encasing material employed in the process causes stresses on the bond wires. Since this molten material is viscous, it tends to place directional forces transversely to the direction of the bond wires as the encasing material is injected into the mold. Such directional forces cause the bond wires to deflect which can, in turn, cause the bond wires to short with adjacent bond wires or bond pads.

Furthermore, wirebonding also experiences problems with wire loop height which dictate semiconductor package thickness, as well as problems with heel breaks disconnecting the wire at a bond from the lead frame and/or bond pad. Further, as semiconductor dice become smaller, wirebonding requires more precise and expensive equipment to place and attach the bond wires.

U.S. Pat. No. 5,252,853 issued Oct. 12, 1993 to Michii ("the '853 patent") illustrates an LOC arrangement on a semiconductor die 40 which does not use bond wires. With reference to FIG. 6 herein, in such an arrangement the leads 42 are extended over the semiconductor die 40 toward centrally located bond pads 44 (shown in shadow). The leads 42 are held in position on the semiconductor die 40 by dielectric tape 46. The leads 42 extend to a position over their respective bond pads 44 wherein the leads 42 are bonded directly to their bond pads 44. Thus, the '853 patent eliminates bond wires and the problem associated therewith.

However, a fundamental limitation in present LOC/LUC semiconductor dice packages exists in the bond pad configurations. As illustrated in the '245 patent and the '853 patent, present LOC/LUC arrangements generally arrange the bond pads in rows along the center. Thus, as the semiconductor industry develops increasingly miniaturized components and greater packaging densities of integrated circuits, the bond pads and bond pad pitch (spacing) must also decrease in size. As the-size of the bond pads decreases, there is less area for lead or wire attachment. The reduction in attachment area requires expensive and more precise bonding equipment and results in an increased likelihood in bonding failures, both of which increase the cost of the semiconductor chip by increasing required capital invested or by lowering chip yields.

So-called "flip-chip" attachment techniques, commonly employing solder reflow or so-called "C4" (for Controlled Collapse Chip Connect) techniques to attach die bond pads to carrier substrate terminals, are also known in the art. The flip-chip bond pads are commonly configured in an array (rectangular, circular, etc.) or in multiple adjacent rows on a wider pitch (spacing) than is commonly employed with conventional, LOC or LUC die and lead frame assemblies. However, to the inventor's knowledge, a "flip-chip" attachment technique to electrically connect and physically secure a die to a lead frame has not been employed. Thus, the robust connections and wide or open bond pad pitch offered by flip-chip techniques have gone unrecognized in the context of lead frame-carried dice.

Therefore, it would be advantageous to develop a technique and a device which allow the semiconductor dice bond pads to maintain a relatively large size and pitch despite decreasing semiconductor size, while using commercially-available, widely-practiced semiconductor device fabrication techniques to arrange and form the bond pads and attach the lead fingers of a lead frame thereto.

SUMMARY OF THE INVENTION

The present invention relates to an apparatus and method for attaching a semiconductor die to a lead frame. More particularly, the present invention relates to employing a "flip-chip" arrayed bond pad die with a lead frame, and relocating electric contact points of a semiconductor die to an array of relatively widely-spaced "open" locations on the semiconductor die active surface such that relatively large and robust interconnections between the electric contact points and the lead frame can be formed.

The device of the invention is constructed by first forming a plurality of semiconductor dice on a semiconductor wafer with a plurality of electric contact points, such as bond pads, dispersed about an active surface of each semiconductor die location on the semiconductor wafer. These electric contact points are dispersed, rather than concentrated as in the prior art, such that each electric contact point can be enlarged to facilitate relatively large interconnections. This arrangement is particularly useful with low pin count devices, such as DRAMS.

To facilitate the large interconnections, some or all of the electric contact points may be rerouted with conductive traces to open locations (i.e., areas with low electric contact point density) on the semiconductor die active surface. For example, a conventional peripheral bond pad arrangement or LOC/LUC central bond pad row arrangement may be reconfigured to present an array of widely-spaced bond pads suitable for direct contact by leads of a lead frame. The conductive traces can be formed by a number of industry standard techniques, such as: depositing a conductive material on the active surface of the semiconductor die, patterning, and etching the conductive material; depositing a conductive paste on the semiconductor die active surface by silk screening the conductive traces directly thereon; directly extruding a conductive paste to form the conductive traces, or applying an insulative material on the semiconductor die active surface, etching a trough in the insulative material, filling the trough with a conductive material, and removing the excess material. These methods are less expensive than relocating the electric contact points during the semiconductor die fabrication process.

Although the formation of the conductive traces is preferably carried out on the semiconductor wafer due to enhanced precision and economic considerations, it is understood that it can be carried out on each semiconductor die after the semiconductor dice have been cut from the semiconductor wafer.

After the electric contact points have been rerouted and the semiconductor dice have been cut from the semiconductor wafer, a lead frame with non-uniform length lead fingers (hereinafter "NULLF") configured to mate with the dispersed bond pad array of a particular semiconductor die is attached to that die. The NULLFs may be of different length, orientation, and/or shape from one another. The NULLFs are directly attached to, and form electrical communications with, the electric contact points of the semiconductor die. The attachment of the NULLFs is generally achieved with solder bumps, conductive epoxy, conductor-filled epoxy, or other conductive connective material as known in the art.

When solder bumps are employed, the bumps are preferably formed on the contact points of the die, as it is easier and less expensive to "bump" a large number of dice simultaneously in wafer form. When the NULLFs are aligned with the contact points of the die, the solder is re-flowed to make connection.

When the NULLFs are attached to the electric contact points with a conductive material such as epoxy or other polymer, the conductive material can be silk screen printed and B-stage cured onto either the semiconductor die contact points or the end of the NULLFs of the lead frame. Furthermore, a suitable epoxy may be "stamped" or "printed" onto the NULLFs just prior to attachment with the semiconductor die using existing equipment, such as that employed to apply adhesives to die-attach paddles. The die-to-NULLF attach is then effected by an in-line furnace as known in the art.

The direct attachment of the NULLFs to the electric contact points eliminates the need for bond wires, in turn eliminating problems associated therewith (including bond failure, wire sweep during packaging, slower processing, loop height minimums, and others well known in the art) and reduces the overall cost of the semiconductor assembly. Further, the placement tolerances attainable by conventional die-attach equipment (±2 mil) are satisfactory for attachment of the NULLFs to the die, thus avoiding the necessity for purchasing special high-precision alignment equipment.

This system is both flexible and cost effective, because the NULLF lead frame design may be easily computer-generated. Thus, the NULLFs of a lead frame can be quickly rearranged and optimized to suit a particular die contact point pattern using computer software. The altered NULLF lead frame can then be quickly produced by existing computerized lead frame fabrication equipment. Therefore, every change of the semiconductor die and/or every reconfiguration or rerouting of the electric contact points can be rapidly accommodated.

The required size of the electric contact points on the semiconductor die is related to the width of the NULLFs and the required minimum pitch between adjacent leads. The NULLFs must only have sufficient space between one another such that lateral shorting between adjacent lead fingers does not occur. Thus, since the electric contact points need only be approximately the same size (i.e., width) of the NULLF, preferably slightly larger for attachment purposes and to accommodate the aforementioned desirable relatively large alignment tolerances, the size of the electric contact points is relatively limited by the maximum width of the NULLFs. Additionally, the size of the electric contact points is also dictated to a certain extent by the overall semiconductor die active surface area. In other words, the electric contact points on the semiconductor die active surface obviously cannot be so large as to contact one another.

A preferred embodiment of the present invention utilizes lead frames similar to existing lead frame strips, wherein multiple frames defining multiple, spaced die sites would exist in a continuous lead frame strip. However, the prior art LOC or LUC step of using a dielectric tape to attach lead fingers to the semiconductor die can be eliminated. The NULLFs are fully cantilevered from the attachment to the bond pads. Standard dam bars hold the NULLFs in place and separate from one another until the semiconductor die assembly is encapsulated. Encapsulation generally consists of placing the semiconductor die assembly in a conventional mold where a molten, particle-filled polymer encasing material is injected into the mold to surround the semiconductor die assembly. Since the majority of the encasing material volume comprises filler particles, the NULLFs' cantilevered height (i.e., between the NULLFs and the semiconductor die active surface) should be greater than at least about 3–4 filler particle sizes high. This requirement is based on the fact that if the cantilevered height were about 1–2 filler particle sizes high, the filler particles would not flow freely under the NULLFs during encapsulation and may be caught between the NULLF and the active surface of the die. With the filler particles so trapped, the pressure of encapsulation can cause the filler particles to puncture the passivation layer on the active surface of the semiconductor die under the NULLFs, enhancing the potential for a short.

Conventional trim and form equipment is thereafter used to singulate, trim mold flash, and trim and form the external leads of the individual semiconductor die packages. Thus, this embodiment results in enlarged electric contact points for robust lead frame connections in an LOC/LUC configuration without requiring tape and/or adhesive as with conventional LOC/LUC assembly.

It is understood that rather than utilizing integral lead frame dam bars, the NULLFs can be carried and held during attachment with adhesive-coated polyimide tape or any other known lead securing technique. It is also understood that the semiconductor die can be encapsulated using mini-forms (e.g., handmolds such as "ice cube" tray molds) and potting compounds, or by any other known encapsulation techniques.

The present invention also achieves a package which is relatively thin in height in comparison to those of the prior art. The use of an LOC/LUC technique results in a lead frame attachment height of about 3–5 mils high above the active surface, as opposed to wirebonding wherein the bond wire loops extend to heights of about 7–8 mils. The package profile may be further reduced by using thin lead frames. Thus, by rerouting the electric contact points to a rougher pitch, using thinner but wider lead fingers, and forming bigger electric contact points, a lesser semiconductor die package height is achieved while maintaining structural integrity and electrical communication required of the assembly.

Thus, the semiconductor die electric contact points can be sized and patterned to provide very robust connections between the semiconductor die and the lead fingers of a lead frame. This resizing and repatterning of the bond pad also allow for a "cruder," e.g., less precise, attachment technique. As noted previously, the semiconductor die attachment tolerances for mutually attaching the semiconductor die and lead fingers according to the invention can be plus or minus 2 mils, easily within the capability of conventional die-attach equipment already in place in industry "fabs." As a consequence, there is no need to purchase expensive, high-precision flip-chip bonders made for multi-chip module (MCM) flip-chip assembly. Thus, the enlarged bond pads allow for a less precise and less accurate bonding equipment to be used, while still achieving effective bonds.

The present invention may also be the only cost-effective method to utilize "partials" from bumped wafers originally intended for flip-chip MCM applications. Partials are individual semiconductor dice which do not yield the expected number of bits under testing and burn-in. For example, there may prove to be only 62 MB of usable memory on a chip instead of 64 MB, or individual semiconductor dice under testing may indicate that all bits are good but other characteristics, such as speed, may be substandard. For example, if a memory chip has a few single bits bad or is substandard, it cannot be used in a multi-chip module. However, the "bad bit" partial could be used for video memory, game memory, or message recorder requiring less memory, and the "substandard" partial could be used for non-demanding applications with lesser currents, voltage, and/or timing factors. Rather than scrapping these partials, the bond pads can be rerouted, as discussed above, for attachment to an NULLF to form a semiconductor device for an alternate use. This process makes use of the lower yielding, less desirable partials, thereby increasing the overall yield.

The present invention provides a system for inexpensive electric contact point relocation and semiconductor die attachment directly to the lead frame, which system is easier and cheaper to employ than present LOC/LUC configurations and assemblies fabricated with wirebonding techniques. Furthermore, it provides die-to-package size and lead-locking advantages of LOC/LUC assemblies without the additional processing steps and the associated problems, as well as eliminating a wire bonding operation and associated problems of wire sweep, loop height minimums, heel breaks, and the like.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PREFERRED EMBODIMENTS

Figure 1:
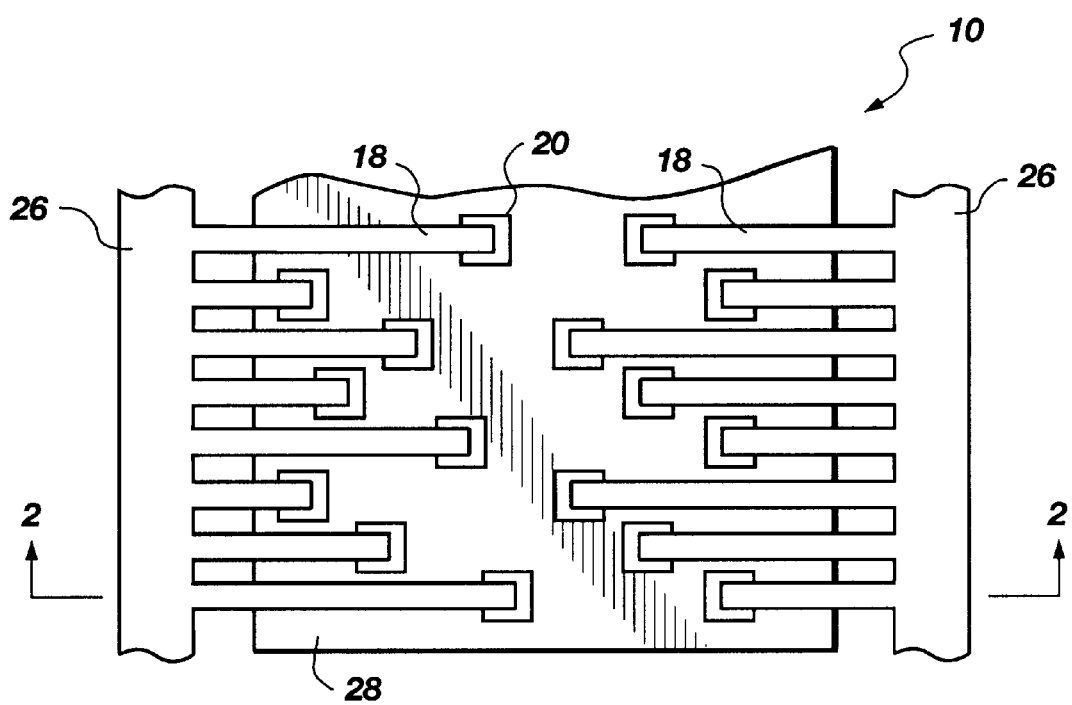
FIG. 1 is a top plan view of a semiconductor die assembly of the present invention.
Figure 2:
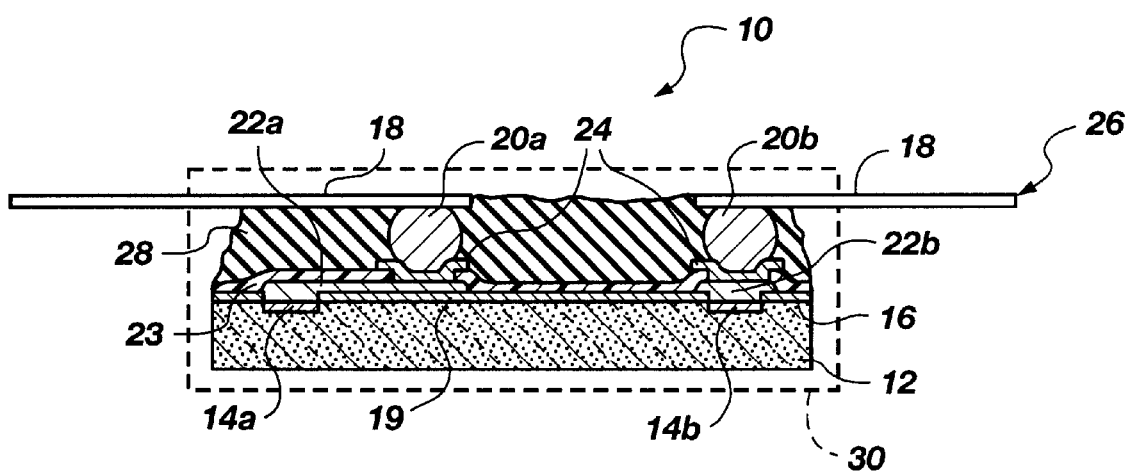
FIG. 2 is a side cross-sectional view of the semiconductor die assembly of the present invention along line 2—2 of FIG. 1.

FIGS. 1 and 2 illustrate a semiconductor die assembly 10 of the present invention. The semiconductor assembly 10 comprises semiconductor die 12 typically of silicon and having a plurality of electric contact points 14a, 14b, such as bond pads, disposed about its active surface 16. A passivation layer 19 covers active surface 16 except where contact points 14a, 14b are exposed. Non-uniform length lead fingers (NULLFs) 18 of a lead frame 26 are in electrical communication with the semiconductor die electric contact points 14a, 14b. The non-uniform length lead fingers 18 are directly attached to and form the electrical communication with the semiconductor die electric contact points 14a, 14b via schematically-depicted discrete conductive material elements 20a, 20b, such as solder bumps, conductive epoxy, conductor-filled epoxy (such as a silver-filled epoxy as used for die-attach to a paddle), or the like. As previously noted, solder bumps are typically formed on the die 12 when still in wafer form, and connection is made to lead fingers 18 by reflow under heat. When a conductive epoxy is used, the conductive material elements 20a, 20b can be silk screen printed and B-stage cured onto either the semiconductor die electric contact points 14a, 14b or the non-uniform length lead fingers 18.

The contact locations for the non-uniform length lead fingers 18 may be rerouted as required with conductive traces 22 (such term including both traces 22a and trace pads 22b) on the semiconductor die active surface 16 over passivation layer 19, which may comprise silicon dioxide, silicon nitride, a phosphosilicate glass (PSG), or a polyimide. It may be possible to configure a non-uniform length lead finger lead frame to accommodate an existing "flip-chip" bond pad pattern, or only selective bond pads might require rerouting as shown in FIG: 2, wherein pad 14a is rerouted with conductive trace 22a, while pad 14b is not rerouted. On the other hand, a more conventional bond pad pattern, such as dual central rows, might require wholesale rerouting. As shown clearly in FIG. 2, even when a bond pad such as 14b is not rerouted, it is desirable to form a conductive trace pad 22b over bond pad 14b as part of the reroute process. This allows all conductive material elements such as 20a and 20b to be deposited and processed more efficiently and with greater planarity of the tops. Such enhanced planarity provides more reliable attachment to the NULLFs. Although formation of the conductive traces 22 is preferably carried out at a semiconductor wafer processing stage, it is understood that it can be carried out on each semiconductor die 12 after the semiconductor dice have been cut from the semiconductor wafer. It is also preferable to cover traces 22 with a thin dielectric layer 23 except at the new contact locations (and those which have not been relocated) to avoid shorting to lead fingers 18. As shown in FIG. 2, conductive elements 20a, 20b particularly if solder bumps, are typically formed on new (rerouted) bond pads or under-bump metallization 24 (UBM) as known in the art of flip-chip fabrication, rather than directly on traces 22.

Optionally, an additional, relatively thicker, layer of dielectric material 28 is disposed after die-to-lead frame assembly between the semiconductor die active surface 16, including the conductive traces 22, and the non-uniform length lead fingers 18. The dielectric layer 28 is generally a polyimide or other polymer underfill material such as an epoxy, or may comprise a so-called "glob top" material such as a silicone gel. Layer 28 is utilized to protect the circuitry in the semiconductor die active surface 16, to prevent potential shorting between the non-uniform length lead fingers 18 and the semiconductor die 12 and to further promote adhesion of die 12 to the NULLFs 18. Layer 28 may optionally extend above and over lead fingers 18.

To assemble a die to an NULLF lead frame, it is contemplated that lead frame strips may be conventionally conveyed in-line to a die attach station, and flip-chip configured (e.g., conductive element array on active surface) dice retrieved by a mechanical sensor or vision-system (pattern recognition system) controlled pick-and-place apparatus, and placed in alignment with the die sites of the lead frames. Alternatively, trays of lead frames or lead frame strips may be presented to the pick-and-place station for greater ease of subsequent placement in a reflow station (solder attach) or curing furnace (polymer attach). Furthermore, NULLF lead frames may be presented on a carrier tape such as a polyimide, and preliminarily secured onto the active surfaces of the flip-chip dice by adhesive on the die side of the tape, solder bumps or conductive polymer elements having been formed on the inner lead ends through apertures in the tape located at the intended bond locations.

When the semiconductor die assembly 10 is complete, it is preferably substantially completely encapsulated in an encasing material 30 (shown in broken lines, FIG. 2), as with prior art devices. As previously noted, the encasing material may comprise a transfer-molded, filled polymer, a potted encapsulant, or other suitable packaging as known in the art.

Figure 3:
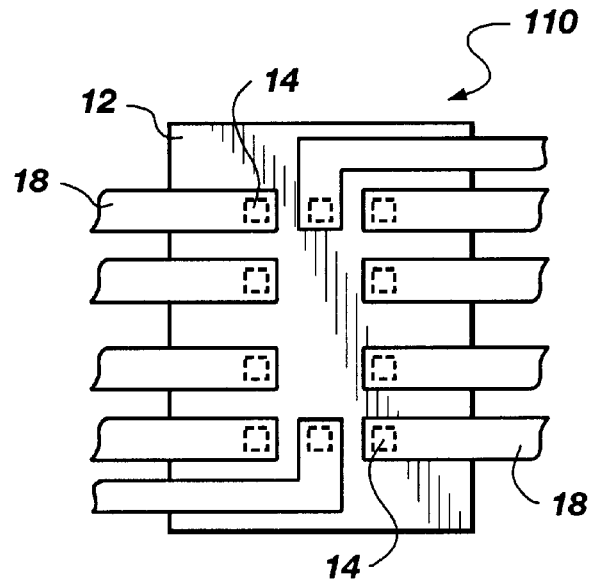
FIG. 3 is a top plan view of another semiconductor die assembly of the present invention.

FIG. 3 depicts an exemplary semiconductor die assembly 10 of the present invention, as viewed from above to illustrate the manner in which the lead fingers 18 of an NULLF lead frame have been configured to directly connect to an array of electric contact points 14 (bearing solder bumps or other conductive elements) of a die 12 which have previously been configured for flip-chip, face-down bonding of die 12 to a conventional conductor-carrying substrate such as a printed circuit board of an MCM module.

Figure 4:
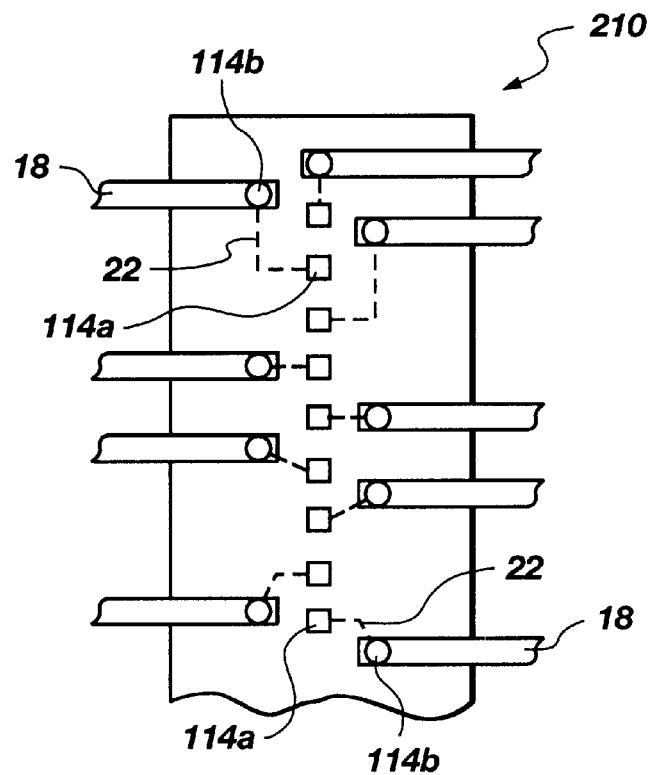
FIG. 4 is a top plan view of yet another semiconductor die assembly of the present invention.
Figure 5:
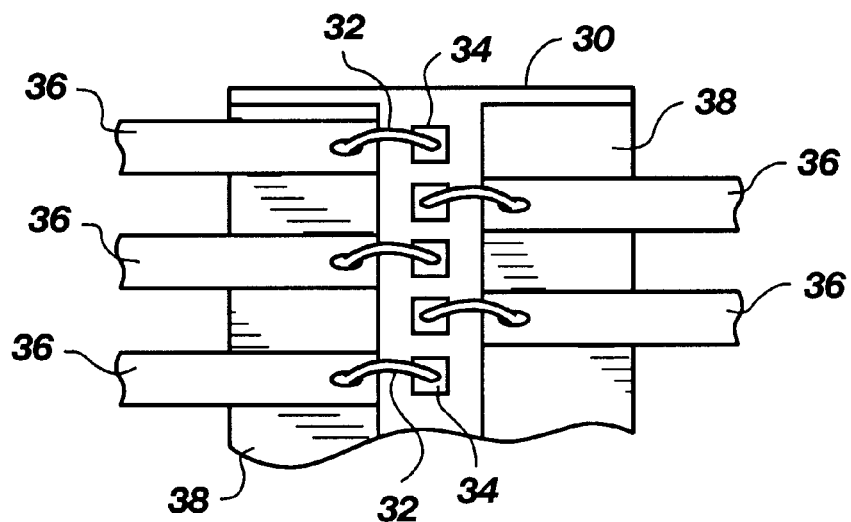
FIG. 5 is a top plan view of a prior art wirebonded LOC semiconductor assembly.
Figure 6:
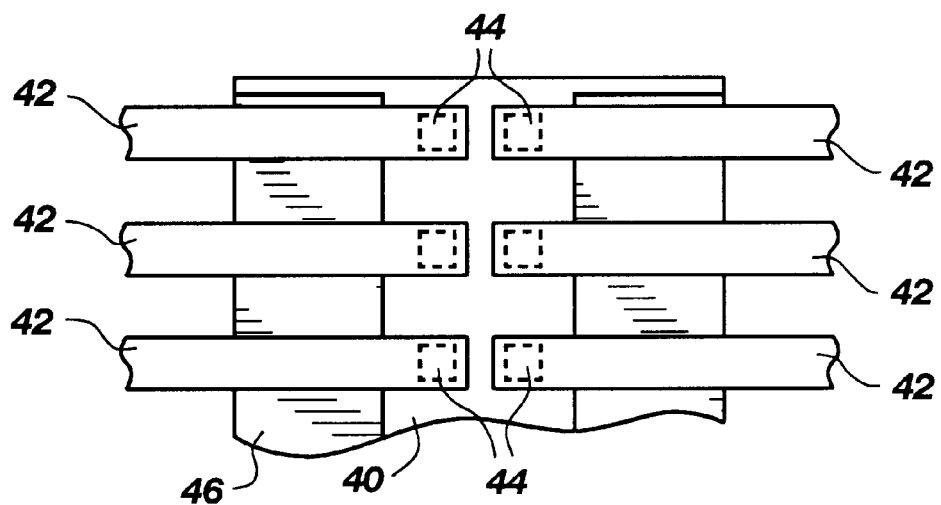
FIG. 6 is a top plan view of a prior art direct attach LOC semiconductor assembly.

FIG. 4 depicts an exemplary semiconductor die assembly 210 of the present invention, as viewed from above to illustrate the manner in which electrical contact points 114a (bond pads) of a die 12 have been rerouted through traces 22 (shown in broken lines under a dielectric) to a more open, widely-pitched array configuration exhibiting relatively larger contact locations 114b for bonding to solder bumps or other conductive elements carried by lead fingers 18, as aligned by loose-tolerance (±2 mil) alignment equipment.

Having thus described in detail preferred embodiments of the present invention, it is to be understood that the invention defined by the appended claims is not to be limited by particular details set forth in the above description as many apparent variations thereof are possible without departing from the spirit or scope thereof.

What is claimed is:

1. A semiconductor die assembly, comprising:
   a semiconductor die having an active surface exhibiting a plurality of electric contact points, wherein a portion of said plurality of electric contact points resides proximate a periphery edge of said semiconductor die, and wherein a portion of said plurality of electric contact points resides proximate a center area of said semiconductor die;
   a lead frame having a plurality of lead fingers disposed adjacent said active surface, portions of said lead fingers of said plurlaity extending in at least partially superimposed relationship to at least some of said plurality of electric contact points;
   discrete conductive material elements interposed between said plurality of electric contact points and said extending lead finger portions, wherein at least some of said plurality of electric contact points are sized to support, in combination, said die from said plurality of lead fingers through said discrete conductive material elements; and a particle-filled polymer encapsulant disposed over said active surface and said lead fingers, substantially all portions of said lead fingers disposed over said active surface being located a vertical distance therefrom at least sufficient to prevent filler particles of said particle-filled polymer encapsulant from wedging between said lead fingers and said active surface.

2. The assembly of claim 1, wherein electric contact points of said plurality are spaced at least sufficiently to preclude lateral contact of two adjacent discrete conductive material elements.

3. The assembly of claim 1, wherein at least some of said plurality of electric contact points lie at ends of laterally-extending circuit traces proximate the active surface of said die and extending from bond pads disposed on said active surface in a differing configuration.

4. The assembly of claim 3, wherein said differing bond pad configuration comprises at least one linear row of bond pads.

5. The assembly of claim 1, wherein vertical distances between said active surface and upper surfaces of said plurality of lead fingers are less than an obtainable loop height above said active surface for an electrical contact point-to-lead finger wire bond.

6. The assembly of claim 1, wherein at least some of said plurality of lead fingers disposed adjacent said active surface of said die comprise lead fingers of diverse lengths and orientations.

7. The assembly of claim 1, wherein said discrete conductive material elements are selected from the group comprising reflowable metallic elements and curable polymer elements including at least one conductive material therein.

8. The assembly of claim 1, further comprising conductive traces extending to said plurality of electric contact points from bond pads disposed in a different configuration on said active surface than said plurality of electric contact points, and further comprising a dielectric layer interposed between said active surface and said traces.

9. A semiconductor die assembly, comprising:
   a semiconductor die having an active surface exhibiting a plurality of electric contact points;
   a lead frame having a plurality of lead fingers disposed adjacent said active surface, portions of said lead fingers of said plurality extending in at least partially superimposed relationship to at least some of said plurality of electric contact points;
   discrete conductive material elements interposed between said plurality of electric contact points and said extending lead finger portions;
   said electric contact points of said plurality are of a size which preclude a linear arrangement on said semiconductor die and said electrical contact points of said plurality are spaced at least sufficiently to preclude lateral contact of two adjacent discrete conductive material elements, wherein at least some of said plurality of electric contact points are sized to support, in combination, said die from said plurality of lead fingers through said discrete conductive material elements; and
   a particle-filled polymer encapsulant disposed over said active surface and said lead fingers, substantially all portions of said lead fingers disposed over said active surface being located a vertical distance therefrom at least sufficient to prevent filler particles of said particle-filled polymer encapsulant from wedging between said lead fingers and said active surface.

10. The assembly of claim 9, wherein at least some of said electric contact points of said plurality of electric contact points lie at ends of laterally-extending circuit traces proximate the active surface of said die and extending from bond pads disposed on said active surface in a differing configuration.

11. The assembly of claim 10, wherein said differing bond pad configuration comprises at least one linear row of bond pads.

12. The assembly of claim 9, wherein vertical distances between said active surface and upper surfaces of said plurality of lead fingers are less than an obtainable loop height above said active surface for an electrical contact point-to-lead finger wire bond.

13. The assembly of claim 9, wherein at least some of said plurality of lead fingers disposed adjacent said active surface of said die comprise lead fingers of diverse lengths and orientations.

14. The assembly of claim 9, wherein said discrete conductive material elements are selected from the group comprising reflowable metallic elements and curable polymer elements including at least one conductive material therein.

15. The assembly of claim 9, further comprising conductive traces extending to said plurality of electric contact points from bond pads disposed in a different configuration on said active surface than said plurality of electric contact points, and further comprising a dielectric layer interposed between said active surface and said traces.

* * * * *

UNITED STATES PATENT AND TRADEMARK OFFICE
CERTIFICATE OF CORRECTION

PATENT NO. : 6,060,769 Page 1 of 1
APPLICATION NO. : 08/940306
DATED : May 9, 2000
INVENTOR(S) : James M. Wark It is certified that error appears in the above-identified patent and that said Letters Patent is hereby corrected as shown below:

In the claims:
CLAIM 1, COLUMN 8, LINE 58, change "of said plurlaity" to --of said plurality--

Signed and Sealed this

Twenty-ninth Day of May, 2007

JON W. DUDAS
*Director of the United States Patent and Trademark Office*